May 11, 1965 T. R. HUFFMAN 3,183,131

SEMICONDUCTOR DIFFUSION METHOD

Filed Aug. 23, 1961

INVENTOR.
Tommie R. Huffman

BY

Mueller & Aichele

ATT'YS.

United States Patent Office 3,183,131 Patented May 11, 1965

3,183,131

SEMICONDUCTOR DIFFUSION METHOD

Tommie R. Huffman, Tempe, Ariz., assignor to Motorola, Inc., Chicago, Ill., a corporation of Illinois Filed Aug. 23, 1961, Ser. No. 133,369
4 Claims. (Cl. 148—189)

This invention pertains to methods for diffusing an impurity element into semiconductor material and in particular relates to a diffusion method whereby unusually precise control over the important properties of a diffused region in semiconductor material is obtained.

At the present time, one of the widely used methods for forming a junction in a semiconductor unit is by diffusing an impurity substance of donor or acceptor type into the material of the unit. In such diffusion processing, no part of the substrate is melted, and the term diffusion as used in the following specification and claims refers to the introduction of impurity material into semiconductor material which remains solid throughout the processing.

In establishing diffused regions in semiconductor material it is extremely important to be able to control the depth of diffusion and the sheet resistivity of the diffused region. The term sheet resistivity means the resistance of a square piece of semiconductor material having an arbitrary thickness, as measured between two parallel faces which are perpendicular to the plane of the square region. Most of the important electrical parameters of a semiconductor device are greatly affected by the diffusion depth and sheet resistivity of the diffused region, so it is necessary to employ diffusion techniques which will permit precise control of these parameters.

Many of the important present day transistors are made of silicon. Boron is commonly diffused into silicon to establish a P type diffused region. Prior art methods of boron diffusion into silicon semiconductor material have typically produced sheet resistivity variations of ±15% and diffusion depth variations of ±10%. Such appreciable variations result in loose distributions of the electrical parameters of devices, and this is undesirable since it often causes devices to fall outside specification limits.

An object of this invention is to provide an improved method of establishing a diffused region in a semiconductor material wherein the important properties of the diffused region are precisely controlled.

Another object of this invention is to provide a method of diffusion, whereby comparatively large numbers of wafers of semiconductor material can be diffused in each diffusion run with no accompanying decrease of control over the important properties of the diffused region.

A feature of the invention is the attainment of very precise control over the diffusion depth and sheet resistivity of a diffused region in a semiconductor material by a diffusion method in which a flat source of the impurity material is spaced equidistantly from and is parallel to the faces of the silicon semiconductor wafers being diffused. With this arrangement, a known and reproducible solid solubility of the impurity in the semiconductor material at the surface of the wafers is produced during the initial stages of diffusion, and this makes it possible to optimize the electrical parameters of the final semiconductor devices since the final concentration and distribution of impurities in the diffused region can be controlled very accurately.

Referring to the drawings.

The method of the invention is preferably practiced in two main steps: A pre-deposition step and a diffusion baking step. The specific placement of the semiconductor wafers relative to the source of impurity material during the predeposition step is an important feature of the method. Impurity material is applied to a flat surface of a member which preferably is part of the so-called "boat" in which the wafers are carried while they are heated in a furnace. The wafers be flat in the same plane, and the surface having the impurity material on it and the wafers being treated are established and maintained parallel to and equidistant from one another during the pre-deposition step such that a uniform and known concentration of impurity material builds up in the wafers at the surfaces thereof facing the impurity source. The wafers are then baked in the second step of the processing so as to diffuse the impurity material further into the wafers and establish a desired final distribution of impurities in the diffused region. Because each wafer in a given run has the same concentration and distribution of impurity material in it after this pre-deposition step, and because the results can be predicted and achieved consistently from run to run, the final properties of the diffused region can be controlled accurately so as to optimize the electrical parameters of the completed semiconductor devices.

Figure 1:
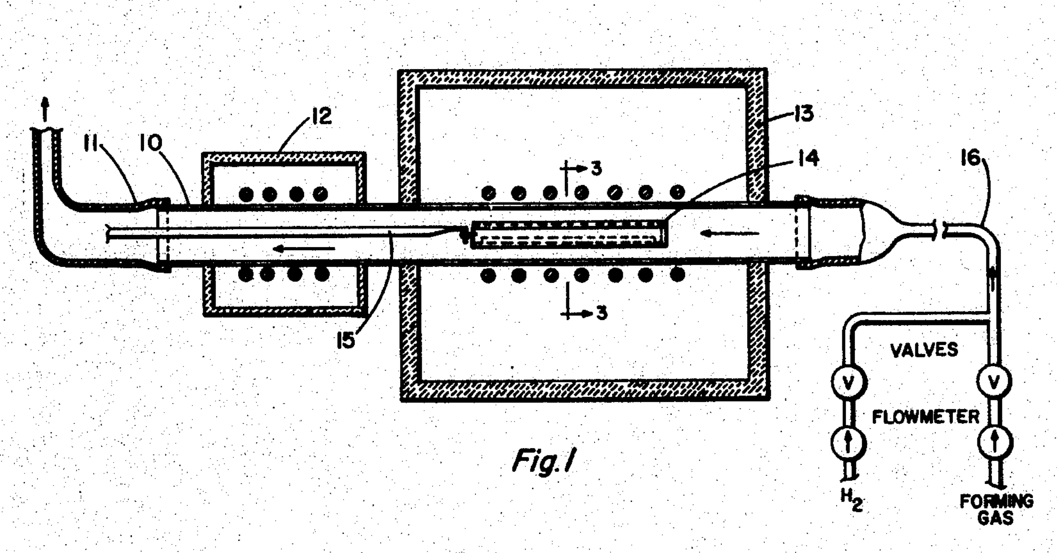
FIG. 1 is a general view showing a diffusion system which may be used in practising the method of the invention.

The over-all diffusion system shown in FIG. 1 includes a quartz tube 10 having a quartz end bell 11. The tube 10 extends through a preheating furnace 12 and a main high temperature diffusion furnace 13. A diffusion boat 14 is shown at the center of the high temperature diffusion furnace within the quartz tube 10. A quartz pull-push rod 15 is used to move the boat in and out of the furnace 13. Gases which are employed for flushing and diffusion purposes are conveyed to the main quartz tube 10 by the tubing 16. The gases flow through the quartz tube 10 in the direction shown, and maintain the desired atmosphere within this tube.

Figure 3:
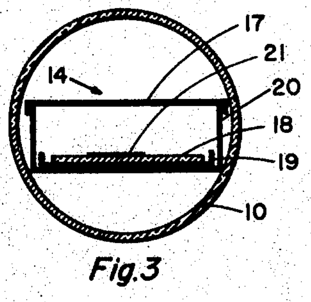
FIG. 3 is a cross-sectional view showing the diffusion boat located within the diffusion furnace.
Figure 2:
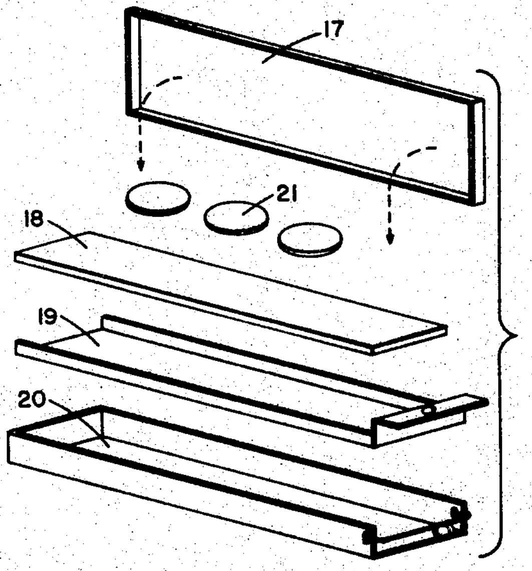
FIG. 2 is an exploded perspective view of a diffusion boat used in the system of FIG. 1.

FIG. 2 is an exploded perspective view of the diffusion boat 14 showing the boat cover 17, a quartz slab 18, a tray or carrier 19 and a boat base member 20. Parts 17, 19 and 20 are preferably made of molybdenum. Three thin wafers 21 of semiconductive material which are to be processed by diffusion are shown in FIG. 2, but it will be understood that the number of wafers which can be processed at one time is variable depending on the size of the boat and the size of the wafers. FIG. 3 shows in section the diffusion boat 14 in assembled condition and resting inside the diffusion tube 10. The carrier 19 rests on the boat base 20, and the quartz slab 18 rests on the carrier 19. The wafers 21 rest on the slab 18 during the diffusion operation.

In preparing the boat 14 for a diffusion operation, impurity material such as boron oxide ($B_2O_3$) is glazed onto the bottom surface of the boat cover 17. The cover thus serves as a backing or support for the impurity material. Some of this impurity material is vaporized during a predeposition step of the diffusion operation which will be described later, and thus the glaze on the boat cover acts as a source of impurity material during this pre-deposition step. A suitable method of applying the boron oxide material to the bottom surface of the boat cover 17 is as follows.

The bottom surface of the boat cover 17 is lightly sandblasted using an Aluminal number 100 grit. The boat cover is then degreased in trichloroethylene and rinsed in isopropyl alcohol, followed by an etching in hydrofluoric acid. Further high purity water rinsing and an ultrasonic washing in isopropyl alcohol are performed and finally the boat cover is blown dry with high purity nitrogen. Boron oxide powder is sprinkled evenly on the sandblasted surface of the boat cover, and the cover is then placed with this surface facing upwards on a quartz slab such as slab 18. The slab 18 and boat cover 17 are put into the diffusion furnace 13 and are baked for one hour in a hydrogen atmosphere at a temperature of approximately 940° C. This firing of the boron oxide material causes the material to form a smooth glazed coating on the sandblasted surface of the boat cover 17.

The slab and boat cover are then removed from the furnace and the cover is lifted from the slab, inverted, and put in position on the boat base 20. Then the boat 14 complete with its base 20, carrier 19, slab 18 and cover 17 is pushed into the center of the diffusion furnace 13 at the position shown in FIG. 1 and is baked for approximately 20 minutes. After this baking operation, the boat is moved to a position at the center of the preheating furnace 12 which is maintained at a temperature of approximately 275° C. and is stored there until a diffusion run is made. The glazed $B_2O_3$ material will flake and drop if the top is moved from the preheater furnace to a cool region or vice versa so the boat is never moved into a cool region except when it is necessary to regenerate the $B_2O_3$ material which occurs occasionally.

As previously mentioned, the diffusion operation involves two main steps: The pre-deposition step and the diffusion baking step. The pre-deposition step may be carried out in the diffusion system of FIG. 1 using the boat 14 with the boron oxide material glazed on the bottom surface of its cover 17. The diffusion baking step can also be carried out in the system of FIG. 1, but for convenience it is desirable to accomplish this in a separate furnace.

In preparation for the pre-deposition step, the silicon wafers are cleaned, etched in hydrofluoric acid and rinsed using methods well known in the art. The quartz end bell 11 is removed, and the carrier 19 is pulled out from the rest of the boat 14 using the push-pull rod 15. The boat cover 17 and boat base 20 remain at the center of the furnace 12. A clean quartz slab 18 is placed in position on the carrier and the wafers, which have one polished face, are placed on the slab with their polished faces up. The carrier, slab and wafers are put back into the tube 10 and using the rod 15 they are pushed into position in the boat base. The boat and wafers thus appear as they are in FIG. 3 with the entire boat assembly 14 being located at the center of the preheating furnace 12. The end bell 11 is replaced on the tube and a 2000 cc. per minute flow of forming gas (95% $N_2$ and 5% $H_2$) is introduced into the tube 10 via the valves. The tube is purged for 15 minutes. The forming gas is turned off and a hydrogen flow of 2000 cc./min. is introduced and allowed to flow for five minutes. The entire boat assembly 14 carrying the wafers 21 is then pushed into the center of the diffusion furnace 13 and the hydrogen flow is immediately reduced to 300 cc./min.

At this point the pre-deposition step has commenced. The boron oxide material is subjected to a high temperature of approximately 940° C. This causes some of the boron to vaporize and produces an appreciable increase in the vapor pressure of the boron in the region within the boat and at the wafer surfaces. The concentration of the boron impurity established at the wafer surfaces is high enough to permit solid-state dissolution of boron in the silicon. The boron oxide material on the boat cover 17 acts as an infinite source of impurity.

During this pre-deposition step a borosilicate glass is formed as an outer layer on the silicon wafer. A second underlying layer is also formed which is a binary lattice structure of boron in silicon. The concentration of boron present in the silicon in this second layer is approximately $2\times10^{20}$ atoms per cubic centimeter. This concentration represents the maximum possible amount of boron that can be put into the silicon at the diffusion temperature employed. The underlying layer extends about .1 micron into the silicon material when a predeposition time of five minutes is used. The distribution of impurity atoms in this .1 micron layer which results from the predeposition step is shown at 24 in FIG. 4. The depth attained during this step can be increased or decreased by predepositing for a longer or shorter time.

The final diffused gradient, and thus the important electrical parameters of semiconductor devices embodying this diffused region, are fundamentally related to the concentration and depth of the predeposited region. Therefore, the ability to establish and reproduce a particular concentration and depth of the predeposited region is very important.

The diffusion boat is semi-closed and this provides a higher concentration of impurity atoms at the top surfaces of the wafers as compared with systems where the wafers are not enclosed. Additionally, the rate of decrease of impurity concentration at the wafer surfaces is not as great as it would be if the diffusion boat were open. Maintaining the wafer faces close and parallel to the source of impurity at a point of relatively high and constant impurity concentration makes it possible to obtain a known final solid solubility of the impurity material in the wafers, and to obtain the same results consistently from run to run.

When the predeposition step has been completed, the hydrogen flow is increased to 2000 cc./min, and the boat 14 is moved to a position where its end opposite the pull rod is at the left end of the diffusion furnace as viewed in FIG. 1. The hydrogen flow is reduced to 300 cc./min. After five minutes the hydrogen is turned off and the tube is flushed with forming gas at a flow rate of 2000 cc./min. for 15 minutes. The end bell 11 is then removed and the carrier, slab and wafers are removed from the furnace.

The second diffusion step, which is the diffusion baking step, is performed as follows. The clean wafers are placed on a quartz slab similar to the slab 18 shown in FIG. 2. This slab, however, has slots in its upper surface, and the wafers are put in the slots so that they stand vertically. The slab with the wafers on it is placed on a conventional diffusion boat, and the boat is placed in the cold zone of a diffusion furnace similar to the furnace 13 of FIG. 1. The boat used for diffusion baking does not have impurity material on it. After gas flushing steps similar to those outlined in connection with the predeposition step, the boat is pushed into the center of the hot zone of the furnace. The wafers are baked for approximately 6 hours at 1115° C. in an oxygen atmosphere. This particular combination of temperature and time will produce a final junction depth of approximately 3 microns assuming a predeposition depth of about .1 micron.

Figure 4:
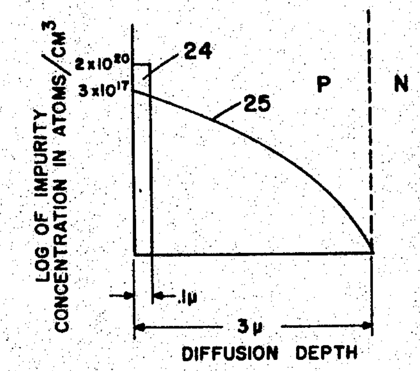
FIG. 4 is a graph showing the distribution of boron impurity atoms in silicon semiconductor material after a pre-deposition step, and also showing the final diffused impurity gradient in the silicon.

As a result of this diffusion step, the distribution of impurity atoms will be altered as shown by curve 25 of FIG. 4. This final distribution of impurity atoms determines the final sheet resistivity in the diffused region. By varying the time and/or temperature during the diffusion baking step, various combinations of diffusion depth and surface concentration can be obtained. However, the final sheet resistivity is basically dependent upon the shape of the pre-deposited impurity distribution 24.

Table I presents data showing typical sheet resistivity measurements made on wafers diffused by the method of the invention. Ten wafers were diffused in each run. The values shown in Table I are an average of three readings taken on a given wafer. The maximum variation of sheet resistivity on a given wafer is ±1 ohm per square. The maximum variation among all the readings taken on wafers diffused in a given run is ±2½ ohms per square.

The maximum variation which occurs from run to run is ±4 ohms per square.

*Table I*

| Run No. | Sheet Resistivity in Ohms/Square | | | | | | | | | |
|---|---|---|---|---|---|---|---|---|---|---|
| 1 | 90 | 86 | 87 | 91 | 90 | 88 | 90 | 88 | 90 | 91 |
| 2 | 85 | 85 | 87 | 89 | 89 | 87 | 93 | 90 | 90 | 89 |
| 3 | 86 | 86 | 90 | 89 | 89 | 91 | 88 | 88 | 91 | 90 |

The diffusion method of this invention greatly aids in obtaining tight control of most of the electrical parameters of diffused junction semiconductor devices. By providing impurity material on a flat surface and positioning the wafers close to and parallel to that surface during the predeposition step, it is possible to establish a particular impurity concentration within the semiconductor material, and this same concentration can be reproduced accurately from run to run. Because of this, the final distribution of impurities and the diffusion depth resulting from diffusion baking can be controlled accurately to optimize the final device parameters. The method of the invention is especially applicable to diffusion of boron into silicon, but other impurity materials and semiconductor materials can be treated in the same way.

I claim:

1. A method of diffusing impurities into semiconductor wafers by pre-deposition and redistribution and characterized by uniform diffusion conditions and results across each wafer and from wafer to wafer, said method including the steps of coating an impurity oxide material on a flat surface of a backing member, heating said backing member to glaze said coating thereon, placing a plurality of semiconductor wafers in a closure structure which includes said backing member such that said wafers all lie flat in the same plane separated the same distance from and parallel to the impurity material on said backing member, placing said closure structure in a heated region of a diffusion system maintained at a temperature to cause vaporization of impurity material from said backing member and diffusion of impurity material into said wafers until a maximum concentration of the impurity for said temperature exists in a surface region of each wafer, and subsequently heating said wafers to redistribute the impurities in said wafers by diffusion.

2. A method of diffusing impurities into semiconductor wafers by pre-deposition and redistribution, said method including the steps of placing a plurality of semiconductor wafers in a closure structure such that said wafers all lie flat in the same plane, assembling a backing member having a planar impurity oxide coating thereon with said closure structure to place the impurity oxide coating in a position facing, and parallel to and equidistant from each of said semiconductor wafers, subjecting the resulting assembly to a temperature sufficient to vaporize impurity material from said coating and diffuse the impurity material into said wafers until a maximum concentration of the impurity for said temperature exists in a surface region of each said wafer, and subsequently heating said wafers to redistribute the impurity in said wafers by diffusion.

3. A method of diffusing impurities into semiconductor wafers by pre-deposition and redistribution, said method including the steps of glazing impurity oxide material on a flat surface of a backing member, assembling said wafers and said backing member with a closure structure such that said wafers all lie in the same plane facing, parallel to and equidistant from the glazed coating on said backing member, subjecting the resulting assembly to a temperature sufficient to vaporize impurity material from said coating and diffuse impurity material into said wafers until a maximum concentration of the impurity for said temperature exists in a surface region of each of said wafers, and subsequently heating said wafers to redistribute the impurities in said wafers by diffusion.

4. A method of diffusing boron into a plurality of semiconductor wafers by pre-deposition and redistribution, said method including the steps of glazing boron oxide material on a flat surface of a molybdenum backing member, assembling a plurality of semiconductor wafers and said backing member with a closure structure such that said wafers all lie in the same plane facing, parallel to and equidistant from the glazed coating on said backing member, placing the resulting assembly in a heated region of a diffusion system maintained at a temperature sufficient to vaporize boron material from said coating and diffuse boron material into said wafers until a maximum concentration of boron for said temperature exists in a surface region of each of said wafers, and subsequently heating said wafers to redistribute the boron therein by diffusion.

References Cited by the Examiner

UNITED STATES PATENTS

| | | | |
|---|---|---|---|
| 2,804,405 | 8/57 | Derick et al. | 148—187 |
| 2,845,894 | 8/58 | McIlvaine | 148—1.5 X |
| 2,870,049 | 1/59 | Mueller et al. | 148—1.5 |
| 2,975,080 | 3/61 | Armstrong | 148—1.5 |

BENJAMIN HENKIN, *Primary Examiner.*

RAY K. WINDHAM, DAVID L. RECK, *Examiners.*